United States Patent
Tseng et al.

(10) Patent No.: US 11,328,775 B2
(45) Date of Patent: May 10, 2022

(54) TERNARY CONTENT ADDRESSABLE MEMORY AND MEMORY CELL THEREOF

(71) Applicant: MACRONIX International Co., Ltd., Hsinchu (TW)

(72) Inventors: Po-Hao Tseng, Taichung (TW); Ming-Hsiu Lee, Hsinchu (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/065,516

(22) Filed: Oct. 7, 2020

(65) Prior Publication Data
US 2022/0108748 A1 Apr. 7, 2022

(51) Int. Cl.
*G11C 15/00* (2006.01)
*G11C 15/04* (2006.01)

(52) U.S. Cl.
CPC .................... *G11C 15/046* (2013.01)

(58) Field of Classification Search
CPC .................................................. G11C 15/046
USPC ........................................................ 365/49
See application file for complete search history.

(56) References Cited

U.S. PATENT DOCUMENTS

| 7,126,854 B2* | 10/2006 | Park | G11C 16/10 365/185.18 |
| 10,373,685 B2 | 8/2019 | Louie et al. | |
| 2007/0007999 A1* | 1/2007 | Graham | G11C 16/0416 326/38 |
| 2008/0278986 A1* | 11/2008 | Sarin | G11C 14/00 365/49.17 |
| 2019/0311769 A1 | 10/2019 | Louie et al. | |
| 2020/0075099 A1* | 3/2020 | Choi | G11C 11/1675 |

FOREIGN PATENT DOCUMENTS

TW  I570891  2/2017

OTHER PUBLICATIONS

"Office Action of Taiwan Counterpart Application", dated Jul. 2, 2021, p. 1-p. 4.

* cited by examiner

*Primary Examiner* — Hoai V Ho
(74) *Attorney, Agent, or Firm* — J.C. Patents (57) ABSTRACT

A ternary content addressable memory and a memory cell thereof are provided. The ternary content addressable memory cell includes a first transistor and a second transistor. The first transistor has a gate to receive a selection signal. A first end of the first transistor is coupled to a match line. A second end of the first transistor is coupled to a source line. The second transistor has a gate to receive an inverted selection signal. A first end of the second transistor is coupled to the match line. A second end of the second transistor is coupled to the source line. The first and second transistors have charge storage structures.

8 Claims, 8 Drawing Sheets

TERNARY CONTENT ADDRESSABLE MEMORY AND MEMORY CELL THEREOF

BACKGROUND

Technical Field

The disclosure relates to a ternary content addressable memory and a memory cell thereof, and particularly relates to a ternary content addressable memory in the form of a flash memory and a memory cell thereof.

Description of Related Art

In the related technologies, a ternary content addressable memory is generally configured based on the structure of a static random access memory, and is often applied to network switches. In such cases, a ternary content addressable memory cell requires multiple (16) transistors to construct, which occupies a large circuit area and causes relatively high power consumption. Due to the limits of power consumption, there are restrictions on applicability.

In some related technologies, a resistive memory can be used to construct a ternary content addressable memory. For such applications, the difference between the on and off resistances of the transistor is usually not large enough, so the voltage difference between the match signals in different states is not obvious enough, which makes it difficult to judge the sense result and reduces the work efficiency of the ternary content addressable memory.

SUMMARY

The disclosure provides a ternary content addressable memory and a memory cell thereof, which increase the density of the memory cells and reduce the required static power consumption.

The ternary content addressable memory cell of the disclosure includes a first transistor and a second transistor. The first transistor has a gate to receive a selection signal. A first end of the first transistor is coupled to a match line, and a second end of the first transistor is coupled to a source line. The second transistor has a gate to receive an inverted selection signal. A first end of the second transistor is coupled to the match line, and a second end of the second transistor is coupled to the source line. The first transistor and the second transistor both have charge storage structures.

The ternary content addressable memory of the disclosure includes a plurality of selection lines, a plurality of match lines, and a memory cell array. The memory cell array includes a plurality of memory cells, and forms a plurality of memory cell columns and a plurality of memory cell rows. Each of the memory cells includes a first transistor and a second transistor connected in parallel, and the first transistor and the second transistor both have charge storage structures. The memory cell columns are respectively coupled to the selection lines, and the memory cell rows are respectively coupled to the match lines.

Based on the above, the disclosure provides a flash memory cell structure to construct the ternary content addressable memory cell. Therefore, the structure of the ternary content addressable memory cell is effectively simplified to realize a high-density layout. In addition, the ternary content addressable memory cell according to the embodiment of the disclosure maintains low current consumption and reduces static power consumption under the condition of a match, and responds quickly and provides a correct match signal instantly under the condition of a mismatch.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
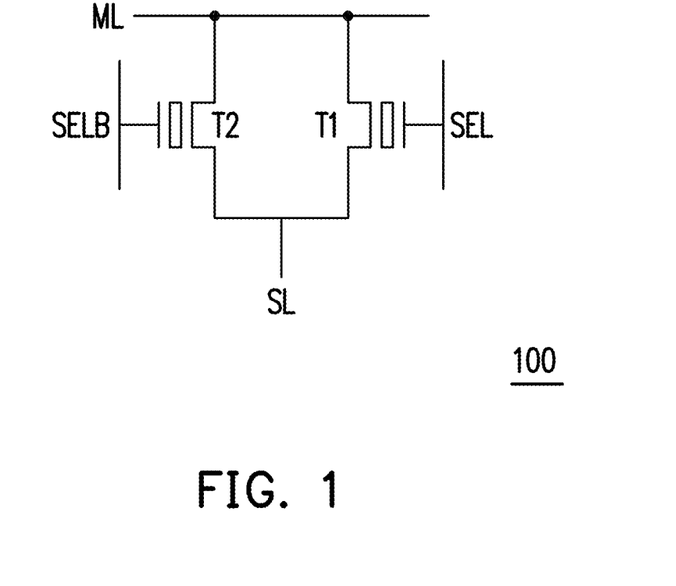
FIG. 1 is a schematic diagram of the ternary content addressable memory cell according to an embodiment of the disclosure.

Referring to FIG. 1, FIG. 1 is a schematic diagram of a ternary content addressable memory cell according to an embodiment of the disclosure. The ternary content addressable memory cell 100 includes transistors T1 and T2. The transistor T1 has a gate to receive the selection signal SEL. A first end (for example, the drain) of the transistor T1 is coupled to a match line ML, and a second end (for example, the source) of the transistor T1 is coupled to a source line SL. In addition, the transistor T2 has a gate to receive the inverted selection signal SELB. A first end (for example, the drain) of the transistor T2 is coupled to the match line ML, and a second end (for example, the source) of the transistor T2 is coupled to the source line SL. The transistors T1 and T2 are connected in parallel. In the present embodiment, the transistors T1 and T2 both have charge storage structures. The transistors T1 and T2 may form a floating gate flash memory cell, a ferroelectric field-effect transistor memory cell, a SONOS flash memory cell or a floating dot flash memory cell.

In the case of storing data, for the ternary content addressable memory cell 100, when the data to be written is logic 0, logic 0 and 1 may be written to the transistors T2 and T1 respectively; and when the data to be written is logic 1, logic 1 and 0 may be written to the transistors T2 and T1 respectively. In addition, if the data to be written to the ternary content addressable memory cell 100 is "don't care", logic 1 and 1 may be written to the transistors T2 and T1.

When a data search operation is performed on the ternary content addressable memory cell 100, a precharge operation may be performed on the match line ML first, so that the match signal on the match line ML is at a precharge voltage. When logic 0 is searched, the inverted selection signal SELB may be set to logic 0, and the selection signal SEL may be set to a search voltage. At this time, if the data stored in the transistors T2 and T1 is logic 0 and 1 respectively (it means that the ternary content addressable memory cell 100 stores logic 0), the transistors T1 and T2 are not turned on (both are turned off), and the match signal on the match line ML is maintained at the precharge voltage and indicates that this search result is a match.

In contrast, if the data stored in the transistors T2 and T1 is logic 1 and 0 respectively (it means that the ternary content addressable memory cell 100 stores logic 1), the transistor T1 is turned on, and the match signal on the match line ML is pulled down to the source signal having a relatively low voltage on the source line SL. At this time, the match signal on the match line ML indicates that this search result is a mismatch.

In the present embodiment, the search voltage may be between 0.5V and 1.5V, and the precharge voltage may be between 0.6V and 1.0V. Nevertheless, the above voltage ranges may be set according to the actual operating voltage received by the memory cell and the process parameters of the wafer, and are not particularly limited.

Furthermore, when logic 1 is searched, the inverted selection signal SELB may be set to logic 1, and the selection signal SEL may be set to a search voltage. At this time, if the data stored in the transistors T2 and T1 is logic 1 and 0 respectively (it means that the ternary content addressable memory cell 100 stores logic 1), the transistors T1 and T2 are not turned on (both are turned off), and the match signal on the match line ML is maintained at the precharge voltage and indicates that this search result is a match.

In contrast, if the data stored in the transistors T2 and T1 is logic 0 and 1 respectively (it means that the ternary content addressable memory cell 100 stores logic 0), the transistor T2 is turned on, and the match signal on the match line ML is pulled down to the source signal having a relatively low voltage on the source line SL. At this time, the match signal on the match line ML indicates that this search result is a mismatch.

In addition, if the data stored in the transistors T2 and T1 is logic 1 and 1 respectively (it means that the data stored in the ternary content addressable memory cell 100 is "don't care"), the transistors T1 and T2 are both turned off, and the match signal on the match line ML is maintained at the precharge voltage and indicates that this search result is a match.

The operation of writing logic 1 and 0 to the transistors T1 and T2 may be completed by performing a programming or erasing operation on the transistors T1 and T2. The above programming operation may be completed by channel hot electron injection (CHE), source side injection or F-N tunneling. The erasing operation may be completed by F-N tunneling or band-to-band hot hole (BTBHH) injection.

Figure 2A:
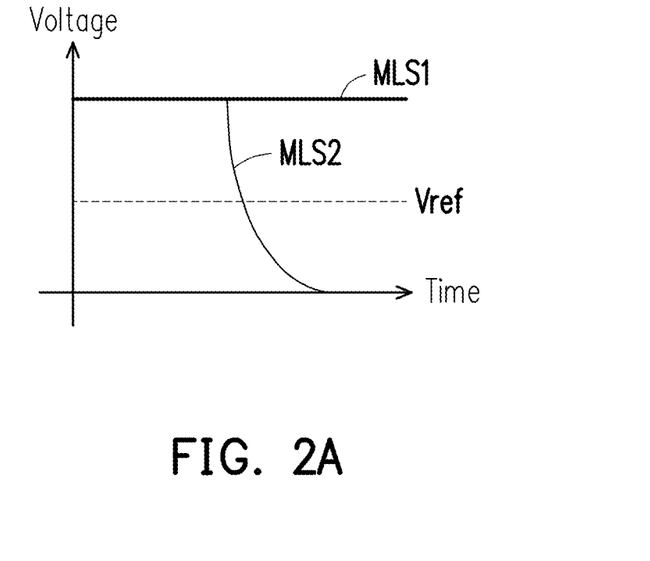
FIG. 2A is a waveform diagram of a match signal of the ternary content addressable memory cell according to an embodiment of the disclosure.

In the embodiment of the disclosure, the ratio of the off resistance to the on resistance of any one of the transistor T1 and the transistor T2 is greater than $10^6$. Therefore, when the transistors T1 and T2 are both turned off, the voltage value of the match signal on the match line ML does not become unstable and drop due to the leakage on the transistors T1 and T2. In addition, when one of the transistors T1 and T2 is turned on, the match signal on the match line ML is pulled down quickly to generate the correct match signal instantly. Here, referring to FIG. 2A, FIG. 2A is a waveform diagram of the match signal of the ternary content addressable memory cell according to an embodiment of the disclosure. When the search result is a match, the match signal may be the curve MLS1 and is maintained substantially equal to the precharge voltage. In contrast, when the search result is a mismatch, the match signal may be the curve MLS2 and is quickly pulled down to the source voltage. Here, the source voltage may be a reference ground voltage.

By determining whether the voltage value of the match signal is greater than or less than a predetermined reference voltage Vref, whether the search result is a match can be quickly and clearly determined.

Figure 2B:
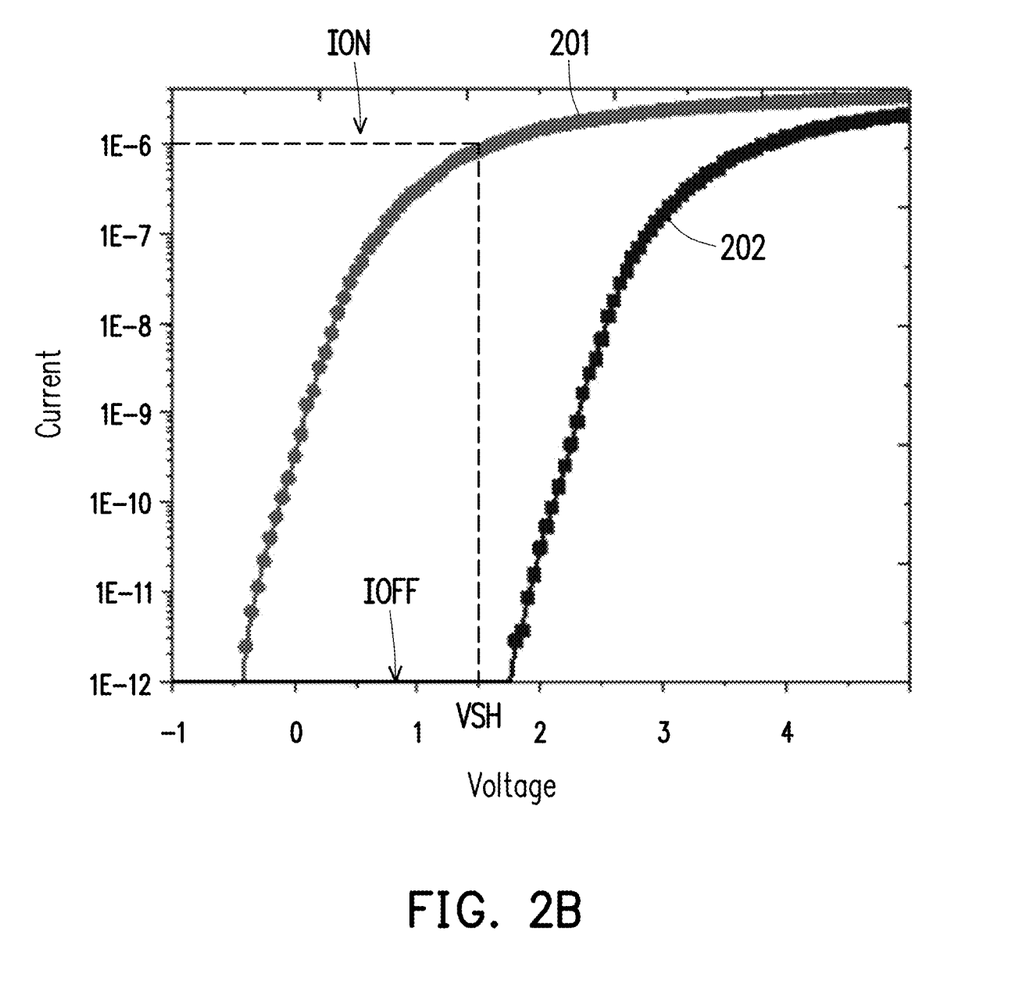
FIG. 2B is a characteristic curve diagram of the transistors in the ternary content addressable memory cell according to an embodiment of the disclosure.

Further, referring to FIG. 2B, FIG. 2B is a characteristic curve diagram of the transistors in the ternary content addressable memory cell according to an embodiment of the disclosure. The curve 201 represents the characteristic curve when the transistor is written with data 0, and the curve 202 represents the characteristic curve when the transistor is written with data 1. When the search voltage VSH of, for example, 1.5V is applied to the gate of the transistor, the transistor to which data 0 is written is turned on, and a relatively high current ION is generated. The transistor to which data 1 is written is turned off, and a relatively low current IOFF is generated, wherein the current ION/IOFF is approximately equal to $10^6$.

Figure 3:
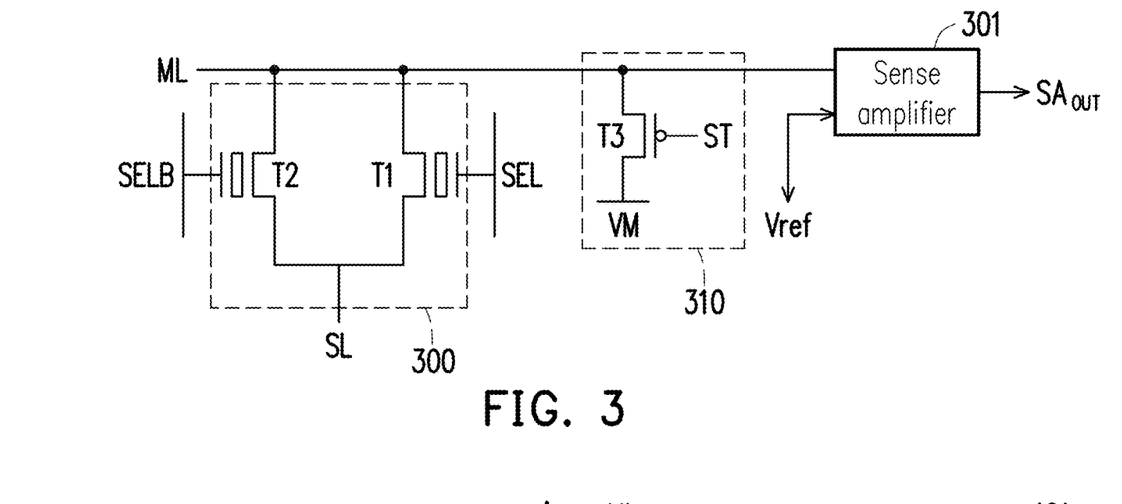
FIG. 3 is a schematic diagram of an embodiment of the ternary content addressable memory cell according to the disclosure.

Hereinafter, referring to FIG. 3, FIG. 3 is a schematic diagram of an embodiment of the ternary content addressable memory cell according to the disclosure. In FIG. 3, a ternary content addressable memory cell 300 is coupled to a precharge circuit 310 through a match line ML, and is coupled to a sense amplifier 301. The ternary content addressable memory cell 300 includes transistors T1 and T2 coupled in parallel. The structure and operation of the ternary content addressable memory cell 300 in the present embodiment are the same as those in the embodiment in FIG. 1, and will not be repeated here.

The precharge circuit 310 is constructed by a transistor T3. In the present embodiment, the transistor T3 may be a P-type transistor, and is turned on in an initial time interval of the search operation according to the start signal ST to pull up the match signal on the match line ML to the precharge voltage VM. After completing the precharging operation of the match signal, the transistor T3 may be turned off.

The sense amplifier 301 is configured to compare the match signal on the match line ML with the reference voltage Vref in the search operation to generate the sense result SA OUT indicating whether the search operation is a match or a mismatch. When the match signal on the match line ML is greater than the reference voltage Vref, the search operation is a match; and when the match signal on the match line ML is less than the reference voltage Vref, the search operation is a mismatch.

The sense amplifier 301 may be implemented using any sense amplifier circuit well known to those skilled in the art. The sense amplifier 301 may also be implemented using a logic inverter. The threshold voltage of the logic inverter may be used as the reference voltage Vref.

Figure 4:
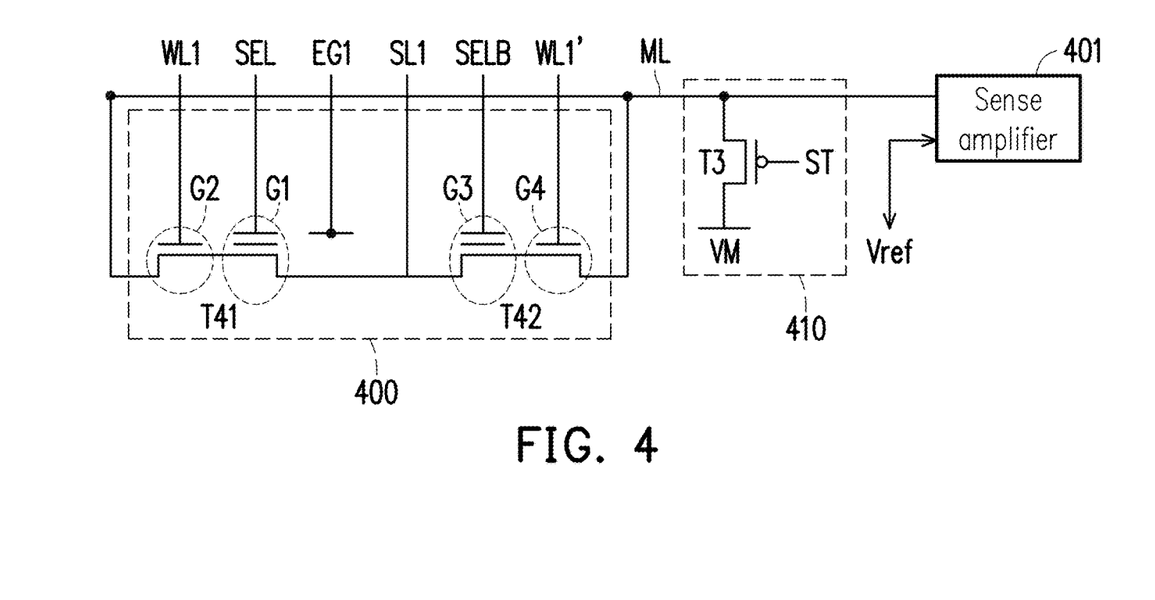
FIG. 4 is a schematic diagram of another embodiment of the ternary content addressable memory cell according to the disclosure.

Hereinafter, referring to FIG. 4, FIG. 4 is a schematic diagram of another embodiment of the ternary content addressable memory cell according to the disclosure. In FIG. 4, a ternary content addressable memory cell 400 is coupled to a precharge circuit 410 and a sense amplifier 401. The ternary content addressable memory cell 400 includes transistors T41 and T42. The transistors T41 and T42 are both double gate transistors. The first gate G1 of the transistor T41 is a floating gate and receives the selection signal SEL. The second gate G2 of the transistor T41 receives the word line signal WL1. The first gate G3 of the transistor T42 is a floating gate and receives the inverted selection signal SELB. The second gate G4 of the transistor T42 receives the word line signal WL1'. The first gates G1 and G3 have charge storage structures.

The drains of the transistors T41 and T42 are both coupled to the match line ML, and the sources of the transistors T41 and T42 are both coupled to the source line SL1.

The ternary content addressable memory cell 400 further has an erase gate EG1 to receive the erase voltage.

When the search operation is performed, the word line signals WL1 and WL1' may be pulled up, and the transistors T41 and T42 are turned on. By receiving the selection signal SEL and the inverted selection signal SELB, the transistors T41 and T42 may be turned on or off according to the stored logic value to correspondingly generate the match signal on the match line ML.

The precharge circuit 410 is constructed by the transistor T3. In the present embodiment, the transistor T3 is turned on in an initial time interval of the search operation according to the start signal ST to pull up the match signal on the match line ML to the precharge voltage VM. After completing the precharging operation of the match signal, the transistor T3 may be turned off.

The sense amplifier 401 is configured to compare the match signal on the match line ML with the reference voltage Vref in the search operation to generate the sense result SA OUT indicating whether the search operation is a match or a mismatch.

The mechanism for determining on or off of the transistors T41 and T42 is similar to that described in the embodiment of FIG. 1, and will not be repeated here.

Figure 5:
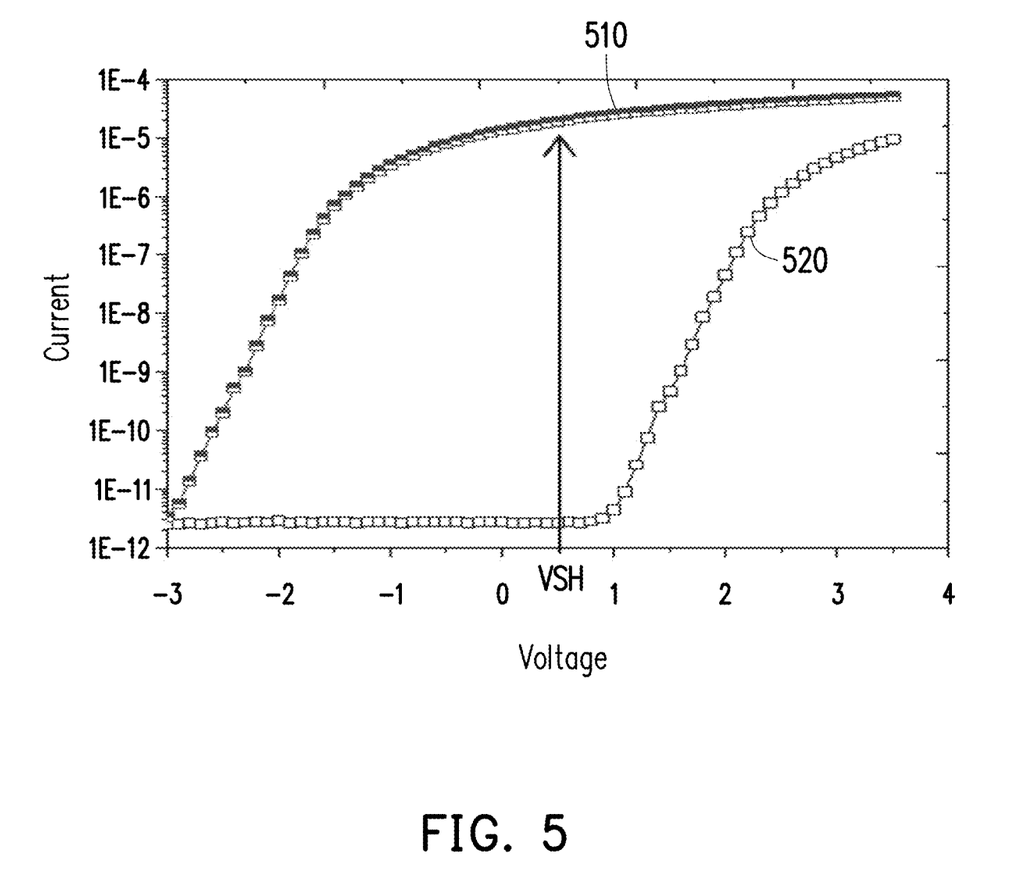
FIG. 5 is a characteristic curve diagram of the transistors in the ternary content addressable memory cell according to the embodiment of FIG. 4 of the disclosure.

Further, referring to FIG. 5, FIG. 5 is a characteristic curve diagram of the transistors in the ternary content addressable memory cell according to the embodiment of FIG. 4 of the disclosure. The curve 510 represents the characteristic curve when the transistor is written with data 0, and the curve 520 represents the characteristic curve when the transistor is written with data 1. When the search voltage VSH of, for example, 0.5V is applied to the gate of the transistor, the transistor to which data 0 is written is turned on and the transistor to which data 1 is written is turned off, and the current ratio between the two transistors (the turned-on transistor and the turned-off transistor) is approximately equal to $10^6$.

In the present embodiment, the transistor written with data 0 may be erased by over erase. Under this condition, the threshold voltage of the transistor written with data 0 may be lower than 0V, for example, -3V.

Figure 6A:
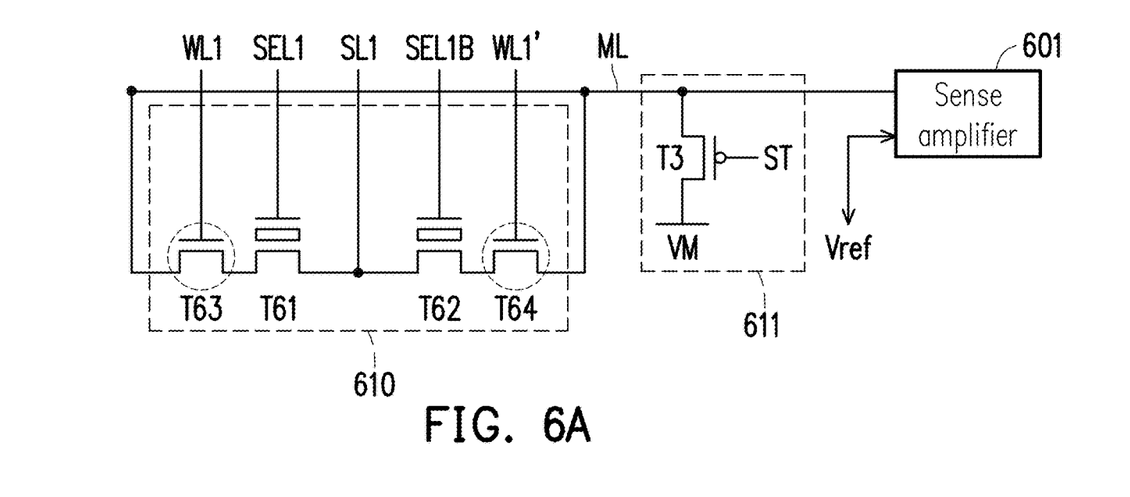
FIG. 6A and FIG. 6B are schematic diagrams of ternary content addressable memory cells according to different embodiments of the disclosure.
Figure 6B:
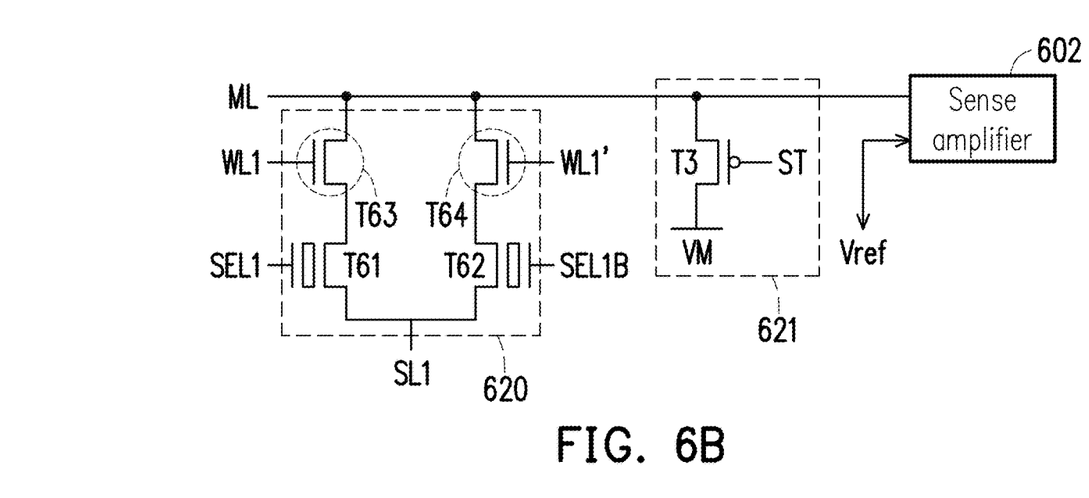

Hereinafter, referring to FIG. 6A and FIG. 6B, FIG. 6A and FIG. 6B are schematic diagrams of ternary content addressable memory cells according to different embodiments of the disclosure. In FIG. 6A, a ternary content addressable memory cell 600 includes transistors T61 to T64. The ternary content addressable memory cell 600 is coupled to a precharge circuit 611 and a sense amplifier 601 through a match line ML. In the ternary content addressable memory cell 600, the transistors T61 and T62 have charge storage structures. The transistor T61 and the transistor T63 are coupled in series between the match line ML and the source line SL1, and the transistor T62 and the transistor T64 are coupled in series between the match line ML and the source line SL1. The gates of the transistor T61 and the transistor T63 respectively receive the selection signal SEL and the word line signal WL, and the gates of the transistor T62 and the transistor T64 respectively receive the inverted selection signal SELB and the word line signal WL'.

When the search operation is performed, the transistors T63 and T64 serve as switches and are turned on according to the word line signals WL and WL' respectively. At this time, the transistors T61 and T62 may be turned on or off according to the selection signal SEL and the inverted selection signal SLEB received respectively based on the stored data, and when one of the transistors T61 and T62 is turned on, the match signal on the match line ML is pulled down, or when the transistors T61 and T62 are both turned off, the match signal on the match line ML is maintained at the precharge voltage VM. Thereby, the sense amplifier 601 compares the reference voltage Vref with the match signal on the match line ML to generate the sense result.

The transistors T61 to T64 may be arranged along a direction parallel to the match line ML.

The mechanism for determining on or off of the transistors T61 and T62 is similar to that described in the embodiment of FIG. 1, and will not be repeated here.

The precharge circuit 611 is constructed by a transistor T3. In the present embodiment, the transistor T3 is turned on in an initial time interval of the search operation according to the start signal ST to pull up the match signal on the match line ML to the precharge voltage VM. After completing the precharging operation of the match signal, the transistor T3 may be turned off.

In FIG. 4B, different from FIG. 4A, the transistors T64 and T62 may be arranged in order along a direction orthogonal to the match line ML. The transistors T63 and T61 may also be arranged in order along the direction orthogonal to the match line ML. According to the illustrations in FIG. 4A and FIG. 4B, it is known that the ternary content addressable memory cell 600 may be arranged in a two-dimensional or three-dimensional manner.

Figure 7:
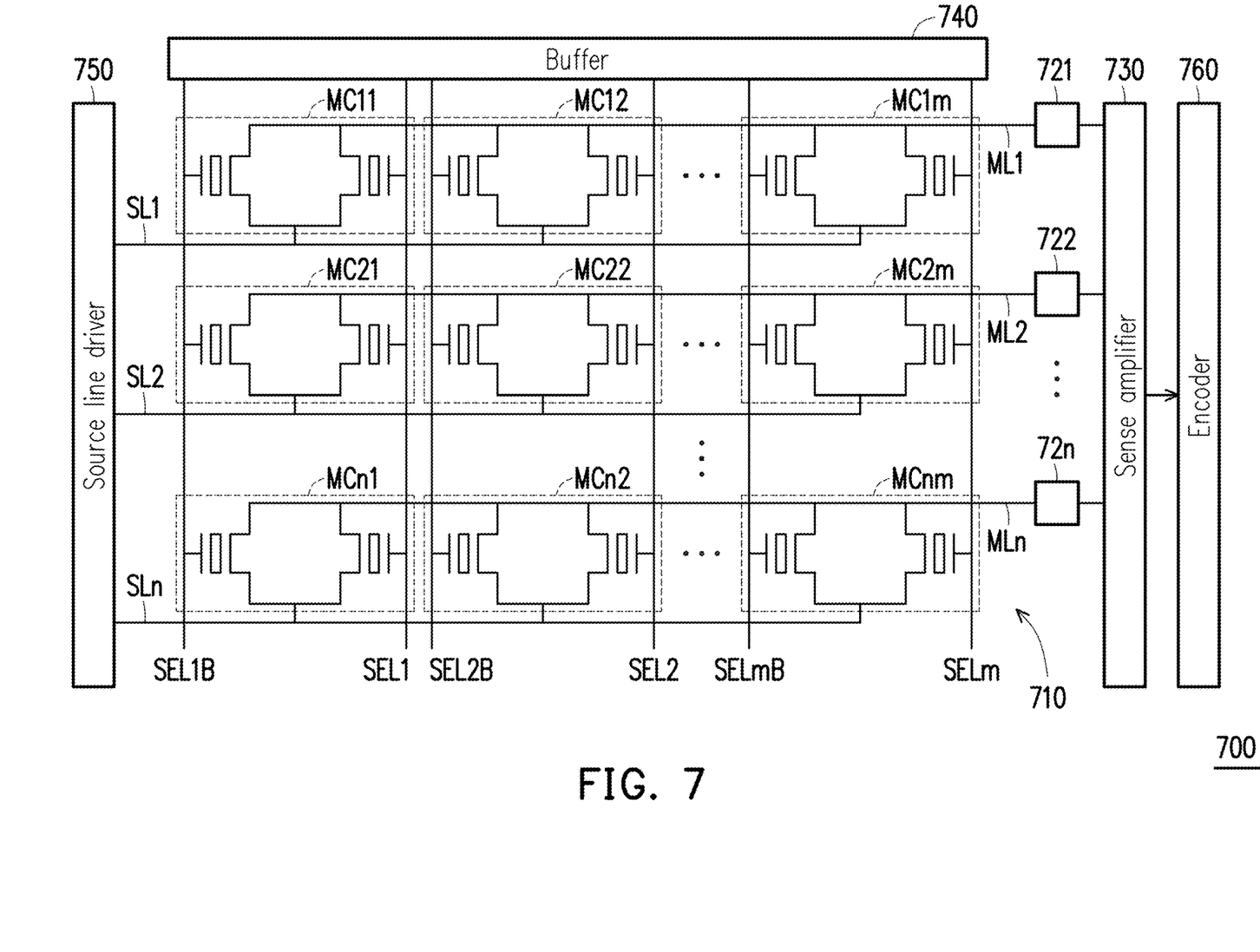
FIG. 7 is a schematic diagram of the ternary content addressable memory according to an embodiment of the disclosure.

Referring to FIG. 7, FIG. 7 is a schematic diagram of a ternary content addressable memory according to an embodiment of the disclosure. The ternary content addressable memory 700 includes a memory cell array 710, precharge circuits 721 to 72n, a sense amplifier 730, a buffer 740, a source line driver 750, and an encoder 760. The memory cell array 710 includes a plurality of ternary content addressable memory cells MC11 to MCnm. The memory cells MC11 to MCnm may be divided into n memory cell rows and m memory cell columns. The memory cells MC11 to MCnm may be constructed according to the ternary content addressable memory cell 100, 400 or 600 in the embodiments of FIG. 1, FIG. 4, and FIG. 6.

The ternary content addressable memory 700 includes a plurality of source lines SL1 to SLn that are respectively coupled to the n memory cell rows in the memory cell array 710. The m memory cell columns in the memory cell array 710 receive the selection signals SEL1 to SELm through a plurality of selection lines respectively, and receive the inverted selection signals SEL1B to SELmB through a plurality of selection lines respectively. The n memory cell rows in the memory cell array 710 are respectively coupled to a plurality of match lines ML1 to MLn, and are coupled to the precharge circuits 721 to 72m and the sense amplifier 730 through the match lines ML1 to MLn. The sense amplifier 730 is coupled to the encoder 760. The encoder 760 is configured to encode the sense result generated by the sense amplifier 730 and generate a match result.

The source line driver 750 is coupled to the source lines SL1 to SLn. The source line driver 750 is configured to generate a plurality of source line driving signals. The buffer 740 is coupled to a plurality of selection lines in the memory cell array 710, and respectively provides a plurality of written data or a plurality of selection signals SEL1 to SELm and inverted selection signals SEL1B to SELmB to the m memory cell columns in the memory cell array 710.

Figure 8:
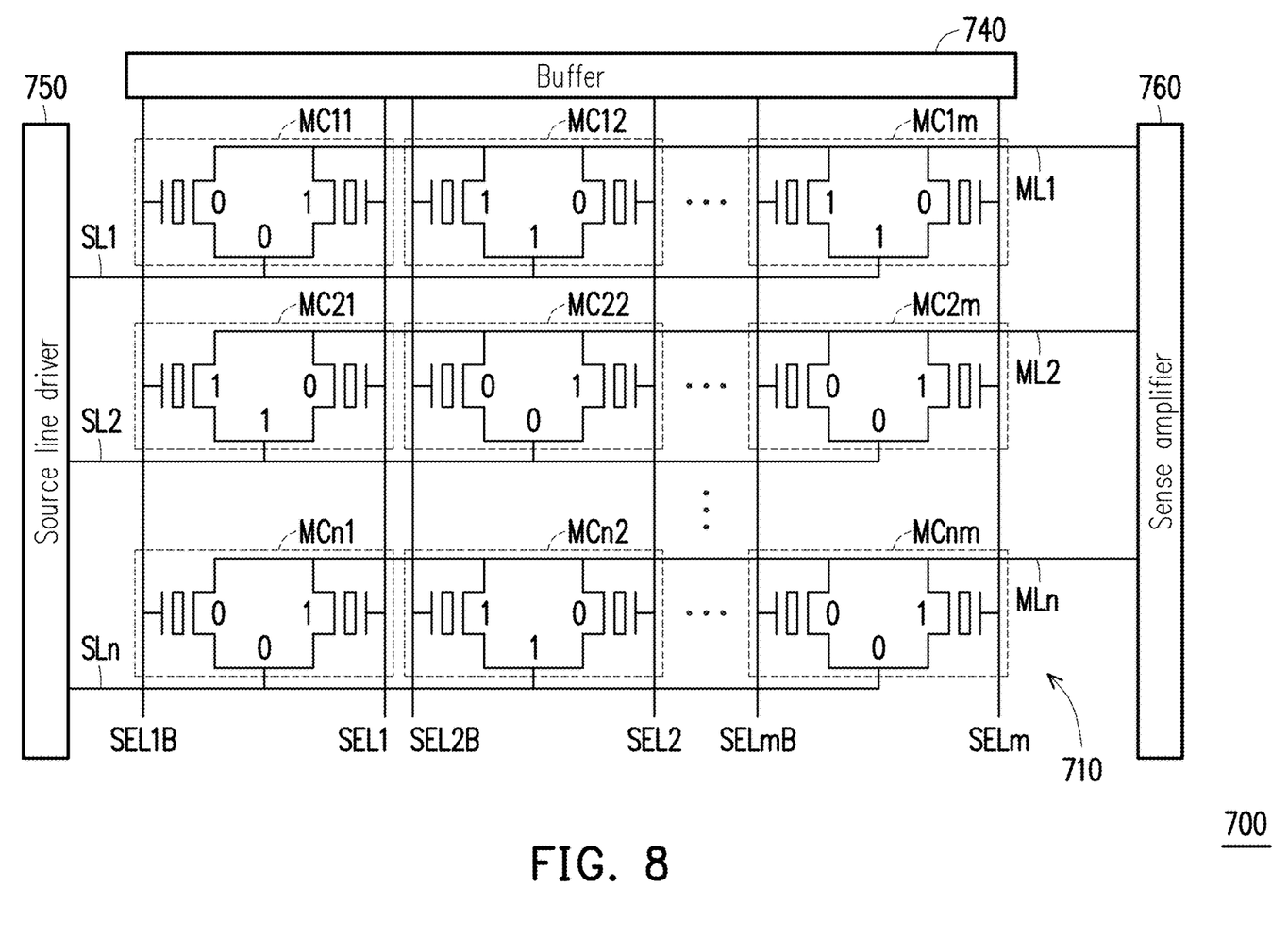
FIG. 8 is a schematic diagram of a search operation of the ternary content addressable memory according to the embodiment of FIG. 7 of the disclosure.

Please refer to FIG. 8 for details of performing the search operation. FIG. 8 is a schematic diagram of the search operation of the ternary content addressable memory according to the embodiment of FIG. 7 of the disclosure. In the initial state, an erasing operation may be performed on all the memory cells MC11 to MCnm. Then, a programming operation is performed on the memory cells MC11 to MCnm, for example, to write the data of logic 0, 1, and 1 to the memory cells MC11, MC12, and MC1m respectively; write the data of logic 1, 0, and 0 to the memory cells MC21, MC22, and MC2m respectively; and write the data of logic 0, 1, and 0 to the memory cells MCn1, MCn2, and MCnm respectively.

In the search operation, the precharge circuits 721 to 72n may set the match lines ML1 to MLn to the precharge voltage in advance. For example, the memory cell array 710 is searched according to the data of logic 1, 0, and 0. The selection signals SEL1, SEL2, and SELm may be logic 1, 0, and 0 respectively, and the inverted selection signals SEL1B, SEL2B, and SELmB may be logic 0, 1, and 1 respectively. The match signal on the match line ML1 is pulled down by the memory cell MC1m that generates a conduction path, and the match signal indicating a mismatch is generated. The transistors of the memory cells MC21, MC22, and MC2m coupled to the match line ML2 are maintained off, and the match signal on the match line ML2 is maintained as a match signal indicating a match (substantially equal to the precharge voltage). The match line MLn is pulled down by the memory cells MCn1 and MCn2 that generate a conduction path, and the match signal indicating a mismatch is generated.

In addition, when the data stored in the memory cell is "don't care", the search operation can still be performed normally. For example, in the case where the data stored in the memory cell MCn2 is changed to "don't care", when the data of logic 0, 1, and 0 is searched, the match signal on the match line MLn may be maintained as a match signal indicating a match (substantially equal to the precharge voltage).

Figure 9:
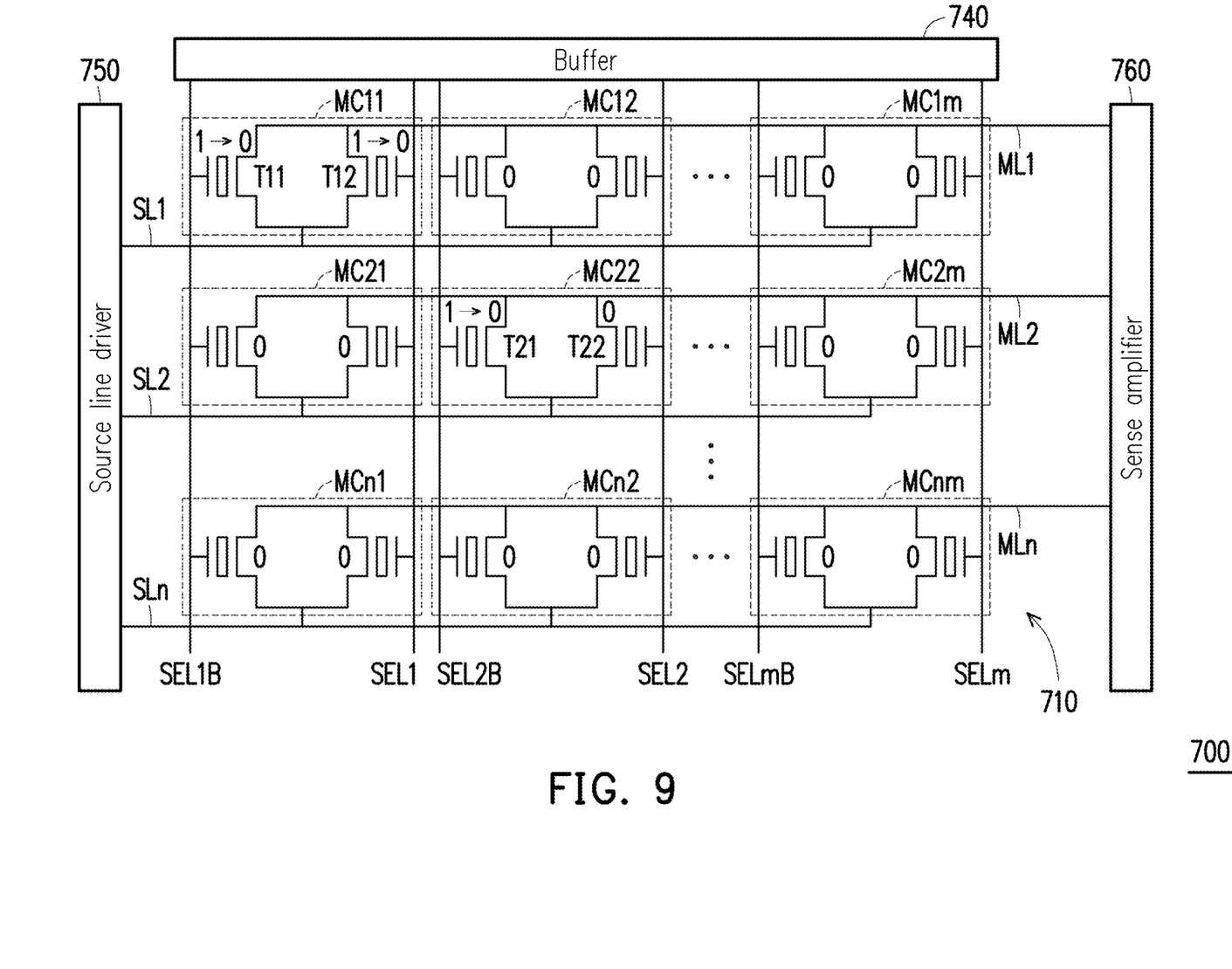
FIG. 9 is a schematic diagram of an erasing operation of the ternary content addressable memory according to the embodiment of FIG. 7 of the disclosure.

Hereinafter, referring to FIG. 9, FIG. 9 is a schematic diagram of the erasing operation of the ternary content addressable memory according to the embodiment of FIG. 7 of the disclosure. In the embodiment of the disclosure, all the memory cells in the memory cell array 710 may be erased together into a state of a low threshold voltage by F-N tunneling. That is, the erased memory cell stores the data of logic 0. Furthermore, in the embodiment of the disclosure, the erasing operation may be performed on a specific memory cell. For example, the memory cell MC11 originally stores the data of "don't care" (the two transistors T11 and T12 both store logic 1), and the memory cell MC22 originally stores the data of logic 1 (the two transistors T21 and T22 store logic 1 and 0 respectively). Through BTBHH injection, the erasing operation may be performed on the memory cell MC11 and the memory cell MC22 one by one.

By providing the inverted selection signal SEL1B of −3V to −10V, the selection signal SEL1 of 0V, and the source signal SL1 of 3V to 10V, for example, the data in the transistor T11 is erased to logic 0. By providing the selection signal SEL1 of −3V to −10V, the inverted selection signal SEL1B of 0V, and the source signal SL1 of 3V to 10V, for example, the data in the transistor T12 is erased to logic 0. For the memory cell MC22, for example, the inverted selection signal SEL2B of −3V to −10V, the selection signal SEL2 of 0V, and the source signal SL2 of 3V to 10V may be provided to erase the data in the transistor T21 to logic 0.

According to the above description, in the embodiment of the disclosure, the structure of the memory cell array 710 allows the transistors in the memory cells therein to be erased one by one, which effectively improves the access performance of the ternary content addressable memory.

In summary, according to the disclosure, the ternary content addressable memory cell is formed using two transistors that have charge storage structures. The leakage that may occur on the match line is effectively reduced to stabilize the match signal indicating a match. The disclosure also accelerates the pulling down of the match signal indicating a mismatch. Therefore, the stability of the ternary content addressable memory cell in determining the match result is improved.

What is claimed is:

1. A ternary content addressable memory cell, comprising:
   a first transistor having a gate to receive a selection signal, a first end of the first transistor being coupled to a match line, and a second end of the first transistor being coupled to a source line; and
   a second transistor having a gate to receive an inverted selection signal, a first end of the second transistor being coupled to the match line, and a second end of the second transistor being coupled to the source line,
   wherein the first transistor and the second transistor both have charge storage structures,
   wherein the first transistor and the second transistor are both floating gate transistors, and the ternary content addressable memory cell further comprises:
   a first switch connected in series with the first transistor between the match line and the source line, and controlled by a first word line signal; and
   a second switch connected in series with the second transistor between the match line and the source line, and controlled by a second word line signal.

2. The ternary content addressable memory cell according to claim 1, wherein a ratio of an off resistance to an on resistance of each of the first transistor and the second transistor is greater than $10^6$.

3. The ternary content addressable memory cell according to claim 1, wherein the first transistor is a double gate transistor, a first gate of the first transistor is a floating gate and receives the selection signal, and a second gate of the first transistor receives the first word line signal, and
   the second transistor is a double gate transistor, a first gate of the second transistor is a floating gate and receives the inverted selection signal, and a second gate of the second transistor receives the second word line signal,
   wherein the second gate of the first transistor forms the first switch and the second gate of the second transistor forms the second switch.

4. A ternary content addressable memory, comprising:
   a plurality of selection lines;
   a plurality of match lines; and
   a memory cell array comprising a plurality of memory cells forming a plurality of memory cell columns and a plurality of memory cell rows, wherein each of the memory cells comprises a first transistor and a second transistor connected in parallel, and the first transistor and the second transistor both have charge storage structures, wherein the memory cell columns are respectively coupled to the selection lines, and the memory cell rows are respectively coupled to the match lines, wherein each of the memory cells further comprises:

a first switch connected in series with the first transistor between the corresponding match line and the corresponding source line, and controlled by a first word line signal; and a second switch connected in series with the second transistor between the corresponding match line and the corresponding source line, and controlled by a second word line signal, wherein the first transistor and the second transistor are both floating gate transistors.

5. The ternary content addressable memory according to claim 4, wherein a ratio of an off resistance to an on resistance of each of the first transistor and the second transistor is greater than $10^6$.

6. The ternary content addressable memory according to claim 4, wherein the first transistor is a double gate transistor, a first gate of the first transistor is a floating gate and receives a selection signal, and a second gate of the first transistor receives the first word line signal, and the second transistor is a double gate transistor, a first gate of the second transistor is a floating gate and receives an inverted selection signal, and a second gate of the second transistor receives the second word line signal, wherein the second gate of the first transistor forms the first switch and the second gate of the second transistor forms the second switch.

7. The ternary content addressable memory according to claim 4, further comprising:

a plurality of precharge circuits respectively coupled to the match lines to perform precharging operations of a plurality of match signals on the match lines.

8. The ternary content addressable memory according to claim 4, further comprising:

a sense amplifier coupled to the match lines and sensing the match signals to respectively generate a plurality of sense results;

a source line driver coupled to the source lines and generating a plurality of source line driving signals;

a buffer coupled to the selection lines and respectively providing a plurality of written data or a plurality of selection signals to the memory cell columns; and an encoder coupled to the sense amplifier and encoding the sense results to generate a match result.

* * * * *